(12) United States Patent
Chetput et al.

(10) Patent No.: US 8,296,699 B1
(45) Date of Patent: Oct. 23, 2012

(54) METHOD AND SYSTEM FOR SUPPORTING BOTH ANALOG AND DIGITAL SIGNAL TRAFFIC ON A SINGLE HIERARCHICAL CONNECTION FOR MIXED-SIGNAL VERIFICATION

(75) Inventors: Chandrashekar L. Chetput, San Jose, CA (US); Abhijeet Kolpekwar, Round Rock, TX (US)

(73) Assignee: Cadence Design Systems, Inc., San Jose, CA (US)

( * ) Notice: Subject to any disclaimer, the term of this patent is extended or adjusted under 35 U.S.C. 154(b) by 281 days.

(21) Appl. No.: 12/714,027

(22) Filed: Feb. 26, 2010

(51) Int. Cl.
*G06F 17/50* (2006.01)
(52) U.S. Cl. ....................... 716/106
(58) Field of Classification Search .............. 716/106
See application file for complete search history.

(56) References Cited

U.S. PATENT DOCUMENTS

| | | | | |
|---|---|---|---|---|
| 5,297,066 | A * | 3/1994 | Mayes | 703/14 |
| 6,691,077 | B1 * | 2/2004 | Burns et al. | 703/4 |
| 7,599,821 | B1 * | 10/2009 | Hou et al. | 703/2 |
| 7,797,659 | B2 | 9/2010 | Chetput | |
| 2011/0083114 | A1 | 4/2011 | Chetput | |

OTHER PUBLICATIONS

Verilog—AMS Language Reference Manual, Analog & Mixed-Signal Extensions to Verilog HDL, Jul. 15, 1998, 238 pages, Version 1.3, Open Verilog International, Los Gatos, U.S.A.
Verilog—AMS Language Reference Manual, Analog & Mixed-Signal Extensions to Verilog HDL, Feb. 18, 2000, 376 pages, Version 2.0, Open Verilog International, Los Gatos, U.S.A.
Verilog—A Reference Manual, Sep. 2004, 118 pages, Agilent Technologies.
Verilog—AMS Language Reference Manual, Analog & Mixed-Signal Extensions to Verilog HDL, Aug. 4, 2008, 402 pages, Version 2.3, Accellera Organization, Inc., Napa, U.S.A.
Verilog—AMS Language Reference Manual, Analog & Mixed-Signal Extensions to Verilog HDL, Aug. 4, 2008, 292 pages, Version 2.3, Accellera Organization, Inc., Napa, U.S.A.

* cited by examiner

*Primary Examiner* — Jack Chiang
*Assistant Examiner* — Brandon Bowers
(74) *Attorney, Agent, or Firm* — Vista IP Law Group, LLP

(57) ABSTRACT

A system, method, and computer program product is disclosed for utilizing dual-value signals, such as hierarchical dual-value signals, for mixed-signal simulation. Such dual-value signals can hold both analog and digital representations of a signal and use the appropriate representations based on which block (analog or digital) for which there is an interaction.

36 Claims, 18 Drawing Sheets

An elaborated design of a 128-bit multiplier with a 128-bit analog bus

An elaborated design of a 128-bit multiplier with a 128-bit mixed bus

METHOD AND SYSTEM FOR SUPPORTING BOTH ANALOG AND DIGITAL SIGNAL TRAFFIC ON A SINGLE HIERARCHICAL CONNECTION FOR MIXED-SIGNAL VERIFICATION

COPYRIGHT NOTICE

A portion of the disclosure of this patent document contains material which is subject to copyright protection. The copyright owner has no objection to the facsimile reproduction by anyone of the patent document or patent disclosure, as it appears in the U.S. Patent and Trademark Office patent file or records, but otherwise reserves all other rights whatsoever pursuant to copyrights.

FIELD

The invention relates to the field of electrical design and verification.

BACKGROUND AND SUMMARY

The invention relates to technology for designing and verifying an electronic design, such as the design of an integrated circuit ("IC").

Modern electronic design is typically performed with computer aided design (CAD) tools or electronic design automation (EDA) systems. To design an integrated circuit, a designer first creates high level behavior descriptions of the IC device using a high-level hardware design language (HDL). Common examples of HDLs include Verilog and VHDL. An EDA system typically receives the high level behavior descriptions of the IC device and translates this high-level design language into netlists of various levels of abstraction. Essentially, the process to implement an electronic device begins with functional design and verification (e.g., using RTL), and then proceeds to physical design and verification.

Circuit designers and verification engineers use different methods to verify circuit designs. One common method of verification is the use of simulation. Simulation dynamically verifies a design by monitoring behaviors of the design with respect to test stimuli. For many types of designs, simulation can and should be performed during the design process to ensure that the ultimate goals are achievable and will be realized by the finished product. The exploding demand for high performance electronic products has increased interest in efficient and accurate simulation techniques for integrated circuits. For analog designs, an analog-based simulation approach such as SPICE is commonly used to implement simulation of the design. For digital circuit, equivalent digital simulation is performed.

With a growing complexity of System-On-A-Chip (SoC) designs, performing mixed-signal simulation has become a very critical aspect of design verification process. A mixed-signal design contains analog as well as digital blocks that interact with each other. The analog blocks require continuous time-domain (analog) simulators to compute their behavior while digital blocks rely on discrete time event driven (digital) simulators. A mixed-signal simulator uses both analog and digital simulation paradigms and performs the required inter-domain communication to simulate the interaction between analog and digital blocks. Such inter-domain communication is a very important component for controlling the accuracy and performance of the mixed-signal simulation. Hardware description languages, such as Verilog-AMS and VHDL-AMS, allow for effective modeling and simulation of mixed-signal designs.

One of the key challenges with mixed-signal verification is the ability to write testbenches which are scalable and reusable for both digital and mixed-signal verification. At the SoC level, the digital verification techniques are employed on the complete digital representation of the design. The testbenches created for verification "assume" the digital representation of the design. To gain more accuracy for certain sensitive design blocks, the abstraction level is switched from digital to analog/Spice. This leads to a "mixed-signal" design configuration that offers ability to perform more accurate mixed-signal verification. Such change in the design configuration essentially leads to a change in the design topology from simulation point of view and the interactions of various signals/blocks needs to be reconsidered.

To explain, consider the example design and testbench configuration for digital verification 102 and mixed-signal verification 104 illustrated in FIG. 1. In pure digital verification, the digital blocks (V1, V2, V3) are verified using a digital testbench, where the blocks V1, V2 and V3 are interconnected. The digital testbench communicates with signals, both within these blocks and between these blocks. As shown in this figure, the SPICE stimulus in digital testbench is not active in the pure digital verification mode.

When one of the digital blocks, e.g., V2, is replaced by a SPICE block such as S2, the design becomes a mixed-signal design. In this case, the user intention is that the digital testbench should continue to verify the digital parts of the design (V1, V3) and any digital signals that connect these blocks. In this configuration, the SPICE stimulus in the testbench block will become active and is used to directly communicate with the SPICE block S2. This communication is typically performed using real numbers to verify the analog block.

To accomplish this, one possible approach is to allow a conventional Verilog-AMS connect module to perform a translation between a digital representation and an analog representation at run-time. The problem with this approach is that this creates a performance penalty at run-time, which can cause delays and excessive resource consumption at the least opportune time. Moreover, requiring the conventional connect module to perform a translation fails to provide the flexibility to assign specific analog values to the translated signal, even if desired by the user.

Another possible approach involves rewriting portions of the testbench to work with the mixed-signal design configuration. While more flexible than the previously-described approach that performs run-time translation using a connect module, this approach is a highly manual process that needs to be executed every time the design configuration is changed to replace a digital representation with an analog representation. Such tight dependency of the testbench on the design configuration creates challenges for maintaining the testbench, is very error-prone, and could lead to significant productivity costs for verification engineers.

Therefore, there is a need for an improved approach to handle the different types of signal traffic for mixed-signal verification and simulation. Some embodiments of the invention address these issues by enabling development of highly effective and reusable testbenches in both pure digital and mixed-signal verification environment, involving the concept of hierarchical dual-value signals for mixed-signal simulation. Such dual-value signals can hold both analog and digital representations of a signal and use the appropriate representations based on which block (analog or digital) for which there is an interaction. Also described herein are simulation semantics that allow declaration, use and computation of such dual valued signals which also supports the ability to auto-select the appropriate signal value representation to eliminate the need for any analog-digital translations. For example, if a dual-value signal is interacting with analog block, the analog value representation is used. This eliminates the need for any analog-digital value conversion and offers direct controllability, observability and accuracy of simulation results. The use of dual-value signal enables very effective verification planning and helps in a tremendous savings in verification cost.

A significant advantage of this approach is that it provides the ability to drive and/or control an analog net segment from the digital testbench without affecting the other (digital) segments of the same signal. Moreover, it provides the ability to control analog nets in the design in this manner, while allowing the remaining analog and digital nets to communicate via standard mixed-signal semantics (e.g., as defined in the Verilog-AMS language). In addition, the effect of driving/controlling an analog net segment can be programmed directly from the digital testbench, which can better reflect the verification needs of the designer or engineer. This approach also allows the ability to reuse the same digital testbench for both digital and mixed-signal verification, irrespective of whether the testbench has some special stimulus for SPICE blocks (which may or may not be part of the design for a given simulation run).

Further details of aspects, objects, and advantages of the invention are described below in the detailed description, drawings, and claims. Both the foregoing general description and the following detailed description are exemplary and explanatory, and are not intended to be limiting as to the scope of the invention.

BRIEF DESCRIPTION OF THE DRAWINGS

FIGS. 6 and 7 illustrate an approach for using compiler directives to provide analog stimulus to an analog block of a circuit design.

FIG. 10 illustrates an example approach for implementing a dual-value signal.

FIG. 12 illustrates an example approach for implementing a connect module that works with dual-value net properties.

DETAILED DESCRIPTION

Some embodiments of the invention are directed to testbenches utilizing hierarchical dual-value signals for mixed-signal simulation that are usable in both pure digital and mixed-signal verification environments. Such dual-value signals can hold both analog and digital representations of a signal and use the appropriate representations based on which block (analog or digital) for which there is an interaction. Also described herein are simulation semantics that allow declaration, use and computation of such dual valued signals which also supports the ability to auto-select the appropriate signal value representation to eliminate the need for any analog-digital translations. For example, if a dual-value signal is interacting with analog block, the analog value representation is used. This eliminates the need for any analog-digital value conversion and offers direct controllability, observability and accuracy of simulation results. The use of dual-value signal enables very effective verification planning and helps in a tremendous savings in verification cost.

To explain and illustrate embodiments of the invention, the present description may refer to or utilize examples that are presented using specific types of languages, formats, and standards, such as Verilog, Verilog-AMS, and SPICE. It is noted, however, that the invention is not limited to these specific types of languages, formats, or standards unless claimed as such.

This document will now provide a brief overview of some background terminology and technology that will be used to describe embodiments of the invention. As used herein, an example of a "signal" is a flattened representation of a net, such as the hierarchical net segments connected together to represent a single signal (a "hierarchical signal"). An example of a "net" segment is a representation of a part of the signal in the given hierarchical level.

Figure 1:
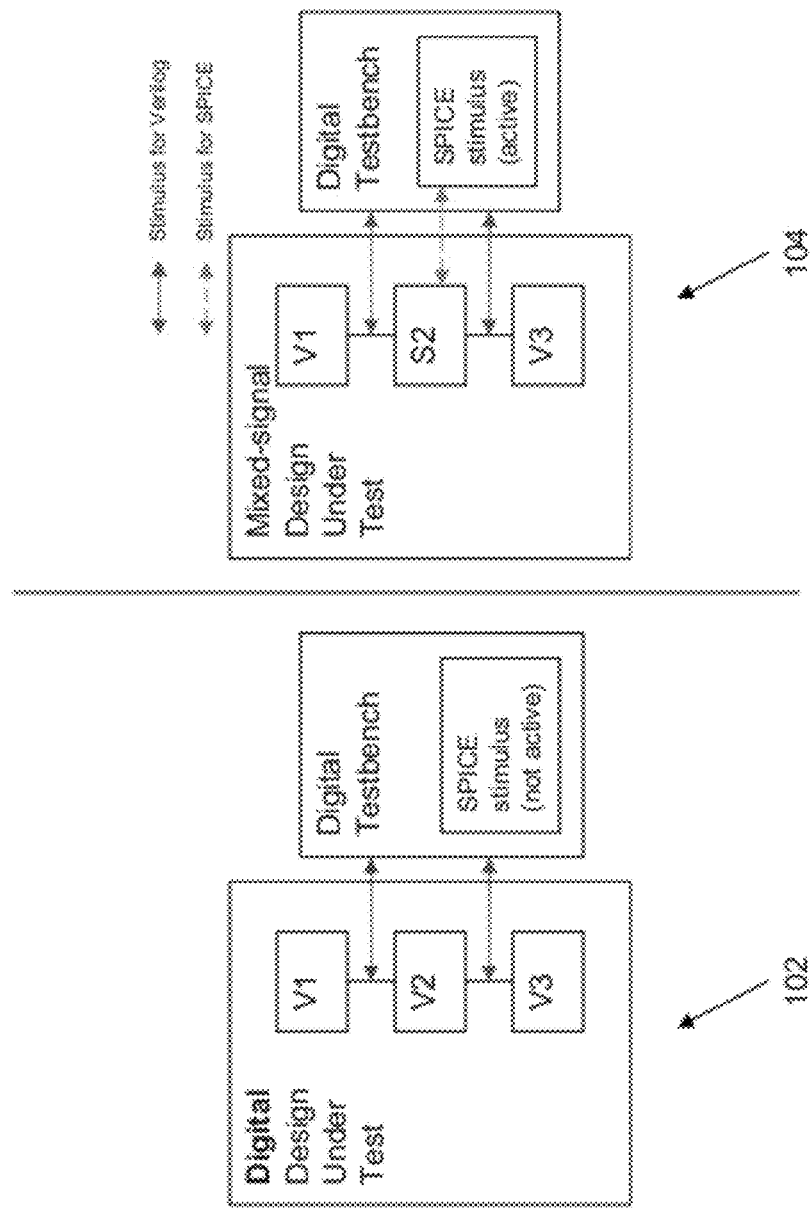
FIG. 1 illustrates digital simulation and mixed-signal simulation.
Figure 2:
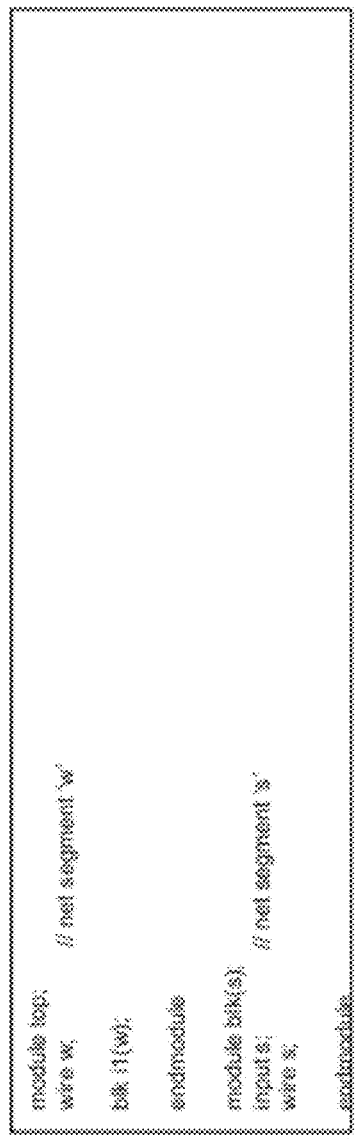
FIGS. 2 and 3 illustrate example circuit designs in code and block forms, respectively.

To illustrate these items, consider the example Verilog code shown in FIG. 2. In this example, 'w' is a net segment in the module 'top' and 's' is another net segment in the module 'blk'. 'w' and 's' are connected via instance 'i1'. By virtue of this hierarchical connection, both 'w' and 's' represent the same 'hierarchical' signal.

Figure 3:
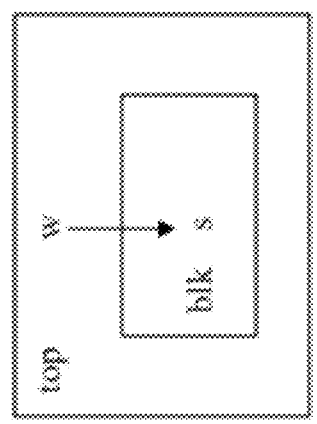

FIG. 3 provides a block-level representation of this example where the nets 'w' and 's' are connected together to form a single signal. According to some configurations, a net segment can either be digital domain net or analog domain net, i.e., it can belong to one domain only and can never be a mixed-signal net segment. A signal can be digital, analog or mixed signal. A signal is digital when all the net segments of that signal are digital. A signal is analog when all the net segments of that signal are analog. Finally, a signal is mixed when at least one of its net segments is digital and at least one of other net segments is analog.

Referring back to FIG. 3, it can therefore be concluded that:
When the net segments 'w' and 's' are both digital, the resulting signal is a digital signal.
When the net segments 'w' and 's' are both analog, the resulting signal is an analog signal.
When the net 'w' is digital and the net 's' is analog or vice-versa, the resulting signal is a mixed-signal net.

With this background in mind, the problem being addressed by embodiments of the invention pertain to verification scenarios in which a design has been configured to be verified in either pure digital mode or in a mixed signal verification mode. The pure digital mode may correspond, for example, to Verilog code that contains compiler directives which conditionally execute depending on the mode of operation, i.e., digital verification versus mixed-signal verification. In pure digital verification mode, the digital signals are driven via standard Verilog driver assignments. In mixed-signal verification mode (e.g., Verilog-AMS), some of the Verilog blocks are replaced with SPICE blocks. There may be a dedicated digital (e.g., Verilog) block which is used as a stimulus for the analog/SPICE blocks. Typically, real numbers are used to drive values directly into the SPICE block. The user may wish to control the SPICE blocks via this special stimulus without influencing the rest of the design (digital blocks).

Therefore, in pure digital verification, the digital blocks are verified using a digital testbench, where the digital testbench communicates with the digital blocks with signals both within and between the digital blocks. The SPICE stimulus in the digital testbench is not active in the pure digital verification mode. However, when one of the digital blocks is replaced by a SPICE block, then the design becomes mixed-signal design. At this point, the digital testbench should continue to verify the digital portions of the design, while the SPICE stimulus in the testbench will become active to directly communicate with and verify the SPICE block.

Figure 4:
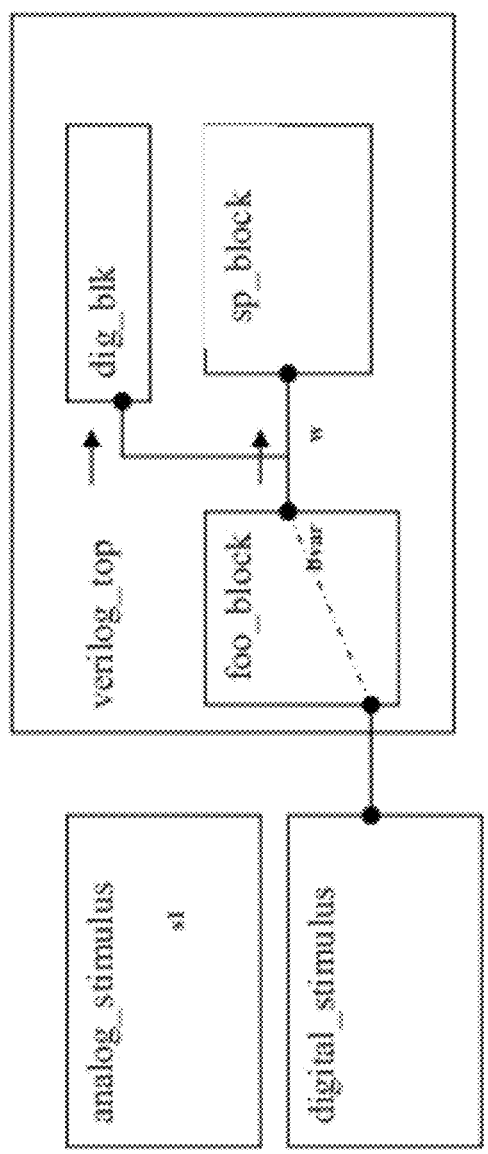
FIG. 4 illustrates stimulus to be applied to a circuit design for simulation.

FIG. 4 shows an example of a Verilog/SPICE design that is to be verified using test vectors, where the test vectors from digital_stimulus are used for the digital/Verilog blocks (foo_block and dig_blk) and test vectors from analog_stimulus are used for the analog/SPICE blocks (sp_block). In this example, the net 'w' is connected between Verilog block 'foo_block' and a SPICE block 'sp_block'. This net connection represents an example of a typical mixed-signal connection between analog/digital boundaries.

If this connection is simulated using standard Verilog-AMS semantics, an analog-to-digital 'connect module' will be inserted between the analog/digital boundary to translate the digital value in 'foo_block' to an analog value in 'sp_block'. A connect module is an interface element that converts or interfaces between analog and digital portions of the electronic design, where the interface elements are configured or configurable to convert signals from digital to analog or vice-versa. As shown in this example, such interface elements may be implemented as Verilog-AMS connect modules that are inserted across digital/analog boundaries using the standard set of protocols defined by the Verilog-AMS specification.

Figure 5:
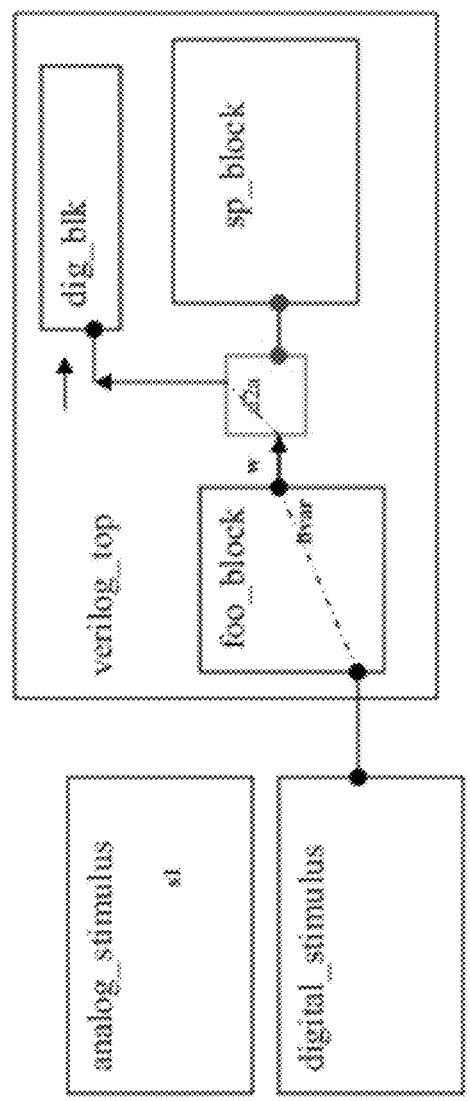
FIG. 5 illustrates insertion of a connect module to provide translation services.

FIG. 5 shows the modified connectivity after design elaboration, in which the elaborated design shows that a 'd2a' connect module is inserted to automatically translate the digital value from 'foo_block' to an analog value in 'sp_block'. The value translation is controlled by the connect module which contains behavioral code to perform the translation.

There are several limitations with this type of an approach. One limitation is that the translation has an associated performance penalty that occurs at run-time. This is a significant problem, particularly if there are many such translations that must occur at run-time, which can cause severe delays and expensive resource usages. Another limitation is that the behavioral code in the connect module is performing the 'd2a' translations. If the user wishes to use a different translation result or has pre-computed the 'd2a' translation and wishes to use that translated value as an analog stimulus for the analog block, there is no way to communicate such translated information using this approach.

Figure 6:
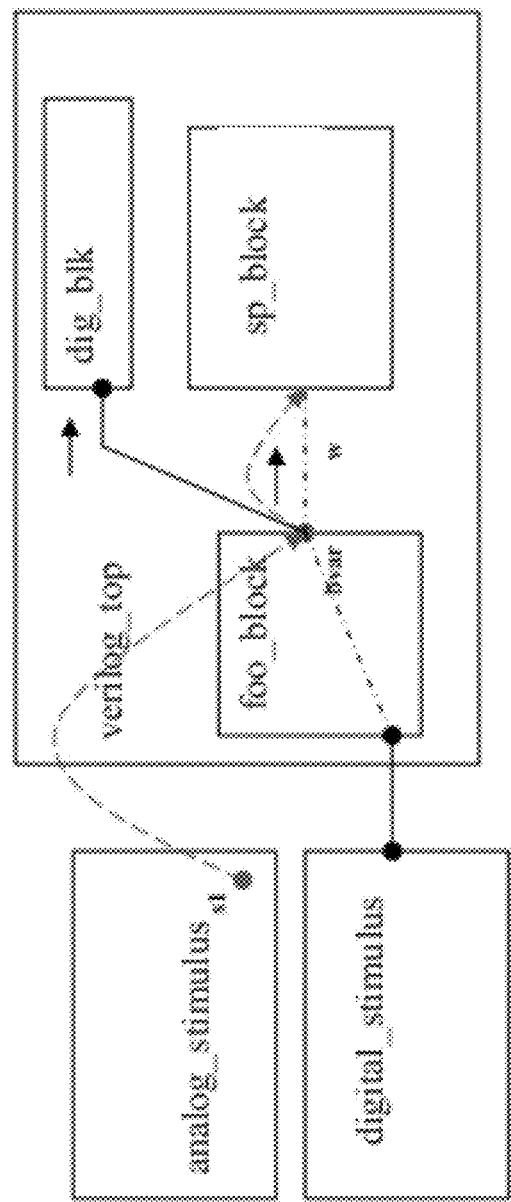

To address these limitations associated with connect modules, a verification engineer may choose to manually edit the design to customize the inputting of translated values to the analog block. As shown in FIG. 6, this approach allows the elaborated design to have the analog stimulus value 's1' directly communicated to the analog block 'sp_block' via its connection to the corresponding digital net 'bvar'.

To accomplish this, the designer/engineer would insert customized system tasks which are enabled via compiler directives into the Verilog code to communicate the translated value to the analog block. For example, the following system task may be used to implement this interaction enabled via a compiler directive, e.g., with "AMS_MODE":

'ifdef AMS_MODE
$special_systask(bvar, analog_stimulus.s1);
'endif

The meaning of this system task is to set the stimulus value 's1' from 'analog_stimulus' block on the analog port to which the digital signal 'bvar' is connected. In the present example, that will be the analog port of the SPICE block.

Figure 7:
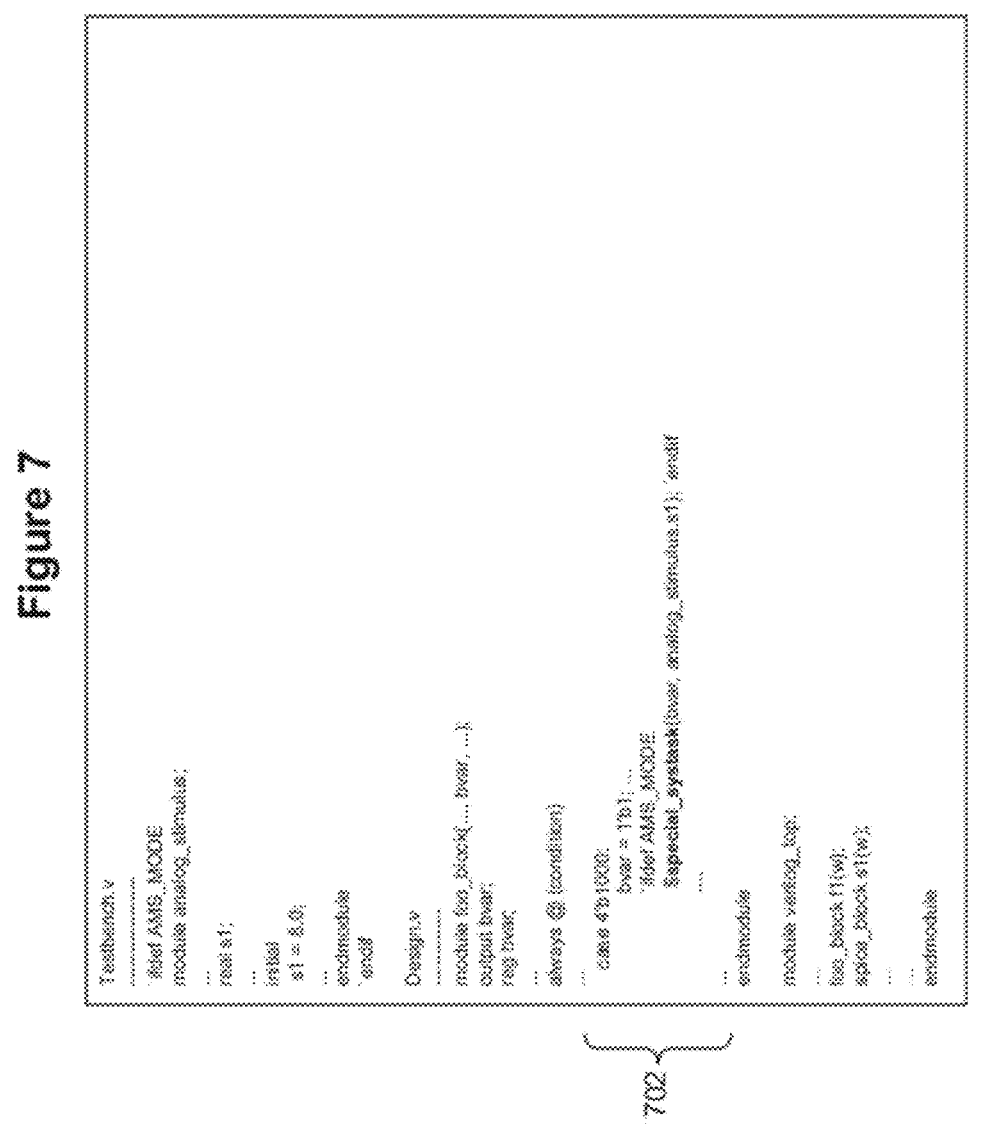

FIG. 7 shows an example Verilog code snippet to demonstrate this approach. In this example, the Verilog system task '$special_systask' is implemented at portion 702 of the code such that the stimulus value 'analog_stimulus.s1' (specified as a second argument to the system task) can be deposited on the SPICE(analog) net(verilog_top.s1.spiceport) which is connected to the digital net 'bvar'(specified as first argument to the system task) via an interconnect net segment 'verilog_top.w'.

While this approach provides a great deal of control over assignment of the analog signal values to the analog blocks, there are also numerous disadvantages with this approach. For example, since the system tasks are embedded within a compiler directive, this forces the designer to have to think about the exact design configuration that is being operated upon, and the designer must ensure that valid connectivity (either digital or AMS) be established before the design can be compiled. Moreover, the system task is likely to be embedded within conditional/case statements, and it is the designer's responsibility to make sure that the suitable system tasks are available to cover all the states of simulation.

In addition, any change in the design configuration will require a corresponding change in the design connectivity and/or testbench specification. This creates a maintenance nightmare for the test engineers. Also, the special interaction at the analog/digital boundary via system tasks does not blend very well with standard signal semantics of mixed-signal simulation, e.g., in languages such as Verilog-AMS or VHDL-AMS.

As is evident, this approach is both very complex and requires a significant amount of time and attention to perform the required coding of the compiler directives. This approach also does not scale very well, and the goal of achieving a success result may be significantly impeded by the time, expense, and possible errors associated with any such task that requires a large amount of manual activity.

One additional limitation of the approaches described with respect to FIGS. 5 and 6 is that these approaches are mutually exclusive for a given simulation run, since only of one of those approaches can be used to simulate a mixed-signal net for a given simulation. There is no conventional way to mix and match those approaches on a specific signal or a block in the same simulation run.

Embodiments of the present invention can address these issues by providing a mechanism to set multiple values on the same signal (e.g., a hierarchical signal). A real value is set for the analog segments of the signal and a logic value is set for the digital segments of the signal. Since the signal has both types of values, the appropriate digital or analog value can be automatically employed when a digital-analog boundary is encountered in the design.

Figure 8:
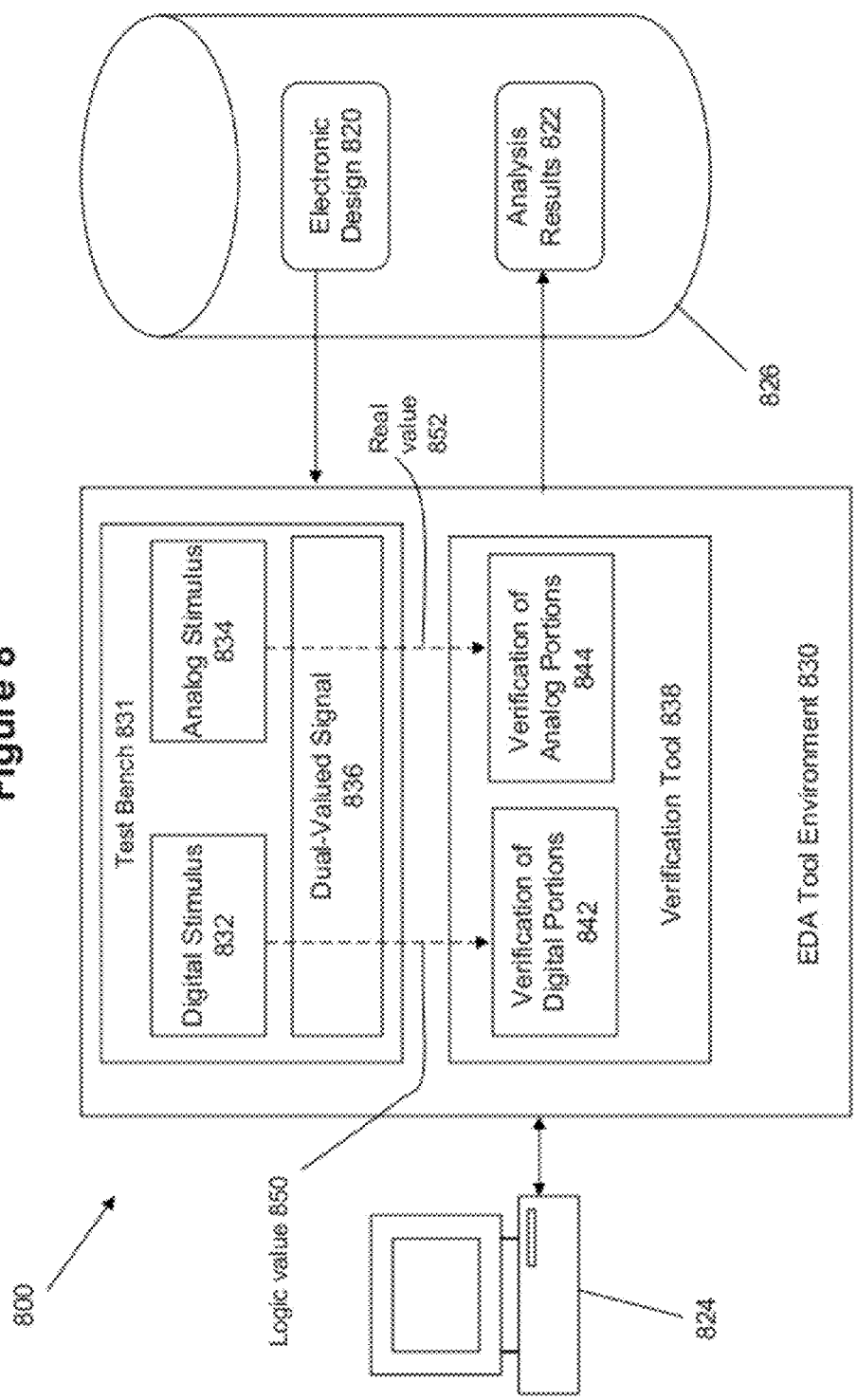
FIG. 8 illustrates an example system for implementing some embodiments of the invention.

FIG. 8 illustrates an example system 800 which may be employed in some embodiments of the invention to utilize dual-value nets to effectively perform verification according to some embodiments of the invention. System 800 may include one or more users at one or more user stations 824 that operate EDA tools 830 within the system 800 to design or verify electronic designs 820. Such users include, for example, design engineers or verification engineers. User station 824 comprises any type of computing station that may be used to operate, interface with, or implement EDA tools, applications or devices 830. Examples of such user stations 824 include for example, workstations, personal computers, or remote computing terminals. User station 824 comprises a display device, such as a display monitor, for displaying processing results 822 to users at the user station 824. User station 824 also comprises input devices for user to provide operational control over the activities of system 800.

The electronic designs 820 may be stored in a computer readable storage device 826. Computer readable storage device 826 comprises any combination of hardware and software that allows for ready access to the data that is located at the computer readable storage device 826. For example, computer readable storage device 826 could be implemented as computer memory operatively managed by an operating system. The computer readable storage device 826 could also be implemented as an electronic database system having storage on persistent and/or non-persistent storage. According to the present embodiment, the electronic design 820 and analysis results 822 are placed into the computer readable storage device 826.

Verification may be performed upon electronic designs 820 using verification tool 838. To perform verification upon the electronic design 820, both digital stimulus 832 and analog stimulus 834 for a testbench 831 are created for the design 820. A dual-value signal 836 is created which includes both the digital stimulus end the analog stimulus. A digital value 850 (e.g., a "logic" value) therefore exists for the digital segments of the hierarchical signal and an analog value 852 (e.g., a "real" value) for the analog segments of the dual-value signal.

When verification tool 838 attempts to verify/simulate the electronic design 820, digital portions of the design are stimulated using the logic value portion 850 of the dual-value signal 836. However, upon reaching a digital-analog boundary in the design, the verification tool 838 can automatically and directly use the real value 852 to stimulate the analog portion of the design. In one embodiment, this is accomplished by implementing a specialized Verilog-AMS connect module that is defined to understand the dual-value signal and to process it suitably to provide the appropriate signal value to the blocks in a design.

Figure 9:
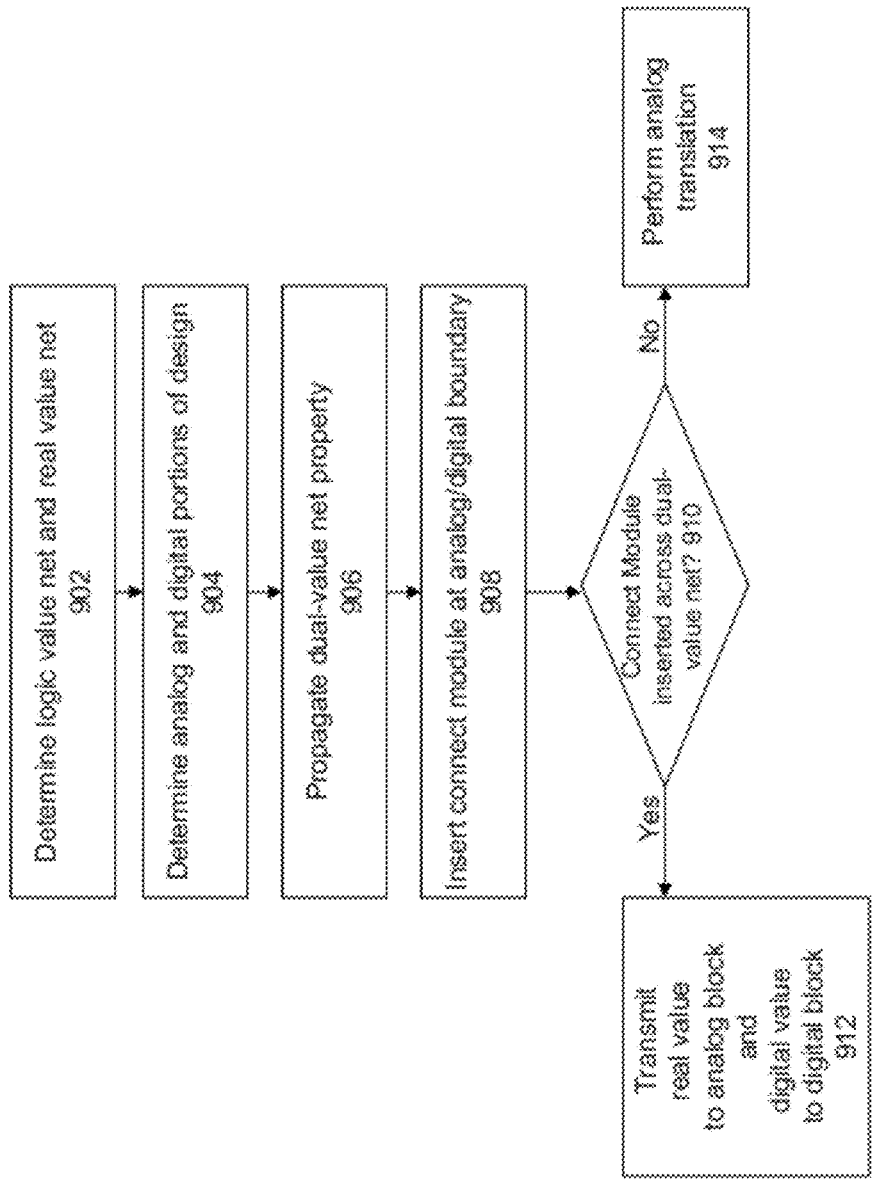
FIG. 9 shows a flowchart of an approach for utilizing dual-value nets according to some embodiments of the invention.

FIG. 9 shows a flowchart of an approach for utilizing dual-value nets to effectively perform verification according to some embodiments of the invention. At 902, a determination is made of the logic net and real net values for the dual-value net. Conceptually, this action is taken to define the two values that will be associated with the dual-value net, where a digital (e.g., logic value) is defined for the digital segments of the signal and an analog (e.g., real) value is defined for the analog segments of the signal.

To accomplish this, a Verilog attribute can be established to associate the two values on the same hierarchical digital net. Any suitable attribute name can be used. For example, the following attribute:
    cds_ams_src can be used as the new Verilog attribute. Therefore, action 902 is taken to identify nets with 'cds_ams_src' attribute and to store the 'logic' value net and its corresponding 'real' value net for hierarchical processing.

Figure 10:
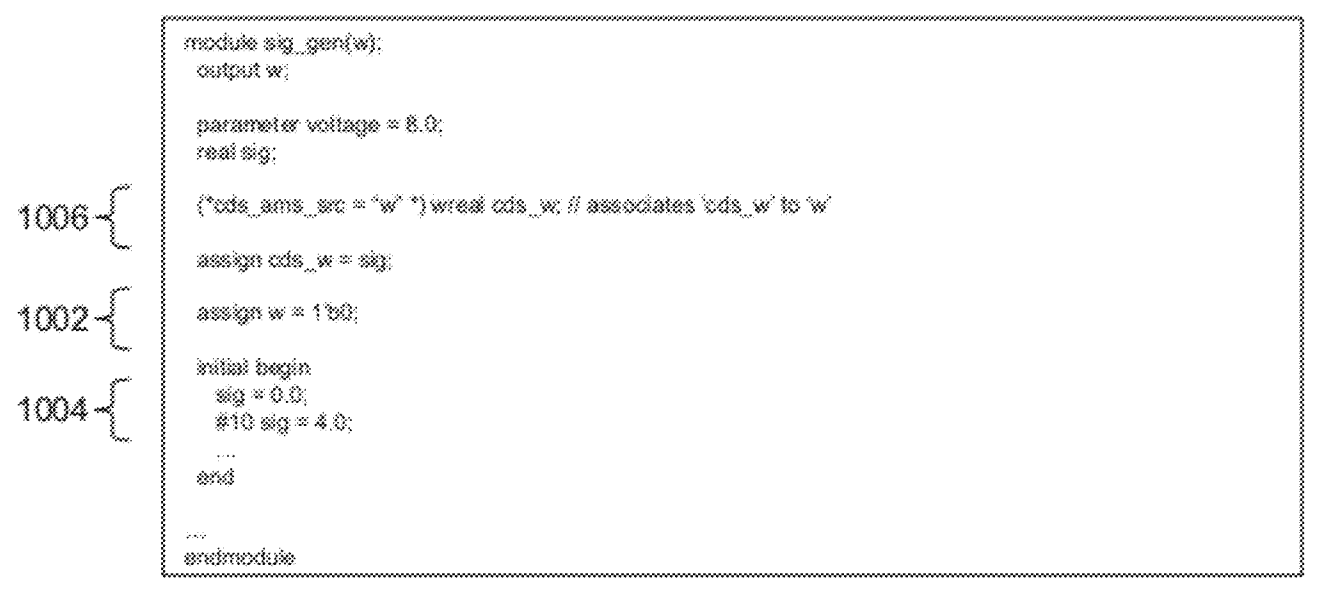

FIG. 10 shows an example of a Verilog module to define a dual-value signal. Line 1006 shows where a digital net 'w' is associated with another digital net 'cds_w' using the 'cds_ams_src' attribute—thereby establishing a special 'dual-value' property between them. Line 1002 would be used to establish the pure digital stimulus for the example net 'w'. Lines 1004 would be used to set the real value information for 'w'.

Returning back to FIG. 9, the next action in the process at 904 is determine the design hierarchy and to partition the design to determine the analog and the digital portions. Any suitable approach can be taken to partition the design into the digital and analog portions. According to one embodiment, during elaboration, the design is flattened and the analog/digital partitions are determined from the flattened design. U.S. patent application Ser. No. 11/699,881, filed on Jan. 1, 2007, entitled "Analog/digital partitioning of circuit designs for simulation", describes one possible approach for performing this partitioning action, and is hereby incorporated by reference in its entirety.

At 906, after the design hierarchy has been determined, the dual-value net property is propagated to the segments of the hierarchical net. This action is taken because it is possible that the dual-value signal has been established at a different level of the design hierarchy from the level at which it is needed. To illustrate, consider the design hierarchy shown in FIG. 11 where a signal established at the Top level of the design may need to traverse numerous hierarchical levels/segments of digital blocks (D1, D2, D5, D6) and analog blocks (A3, A4, A7). Action 906 is taken to make sure that the dual-value will be adequately propagated through this type of hierarchy.

At 908, specialized interface elements are inserted at analog/digital boundaries, where the specialized interface elements perform, for example, logic to real conversions using the dual-value signal that was previously established. According to one embodiment, a Verilog-AMS "L2E" connect module is utilized as the specialized interface element to perform the logic to real conversions. A determination is made at 910 whether the connect module is connected across a dual-value net, e.g., by checking whether the 'dual-value' digital signal connected to the L2E connect module has a 'real' valued driver. If so, then at 912, if driving an analog block, the analog value (e.g., real value of the dual-value net) is directly transmitted to the analog block, and if driving a digital block, then the digital value (e.g., logic value of the dual-value net) is transmitted to the digital block. If the connect module is not connected across a dual-value net (i.e., it is not a "dual-value" signal), then the connect module performs at 914 as a regular L2E connect module and will perform the default translation as specified pursuant to Verilog-AMS semantics.

As noted above, the specialized interface element may be implemented as a specialized connect module using Verilog-AMS language semantics. According to one embodiment, the connect module contains a special attribute which is exercised when this connect module is inserted across a digital signal which has the dual-value property. Any suitable attribute may be employed for this purpose. According to one embodiment, the attribute entitled 'cds_ams_target' may be used for this purpose.

FIG. 12 shows an example of a specialized connect module that is configured to handle a signal which has the dual-value property. The attribute 'cds_ams_target' for the dual-value signal is shown at line 1202. Portion 1204 is utilized to check whether a real value stimulus is needed, e.g., based upon recognition of a real value driver for the signal. If not, then the real value portion of the signal is ignored and the connect module performs like an ordinary L2E initializations pursuant to the Verilog-AMS semantics, and at portion 1206, the regular behaviors of the L2E connect modules are performed. However, if portion 1204 determines that a real value is needed and a real value driver exists, then portion 1208 is applied to communicate the real value of the dual-value signal to the analog/SPICE block.

Therefore, when an instance of the L2E connect module is inserted across a dual-value digital signal which has a driver/stimulus for an analog block, then the code that transmits the stimulus to the analog block is enabled. Otherwise, the regular L2E translation code is enabled. This enables the same connect module to be used for both regular L2E insertion and special 'dual-value' signal L2E insertion.

Figure 13:
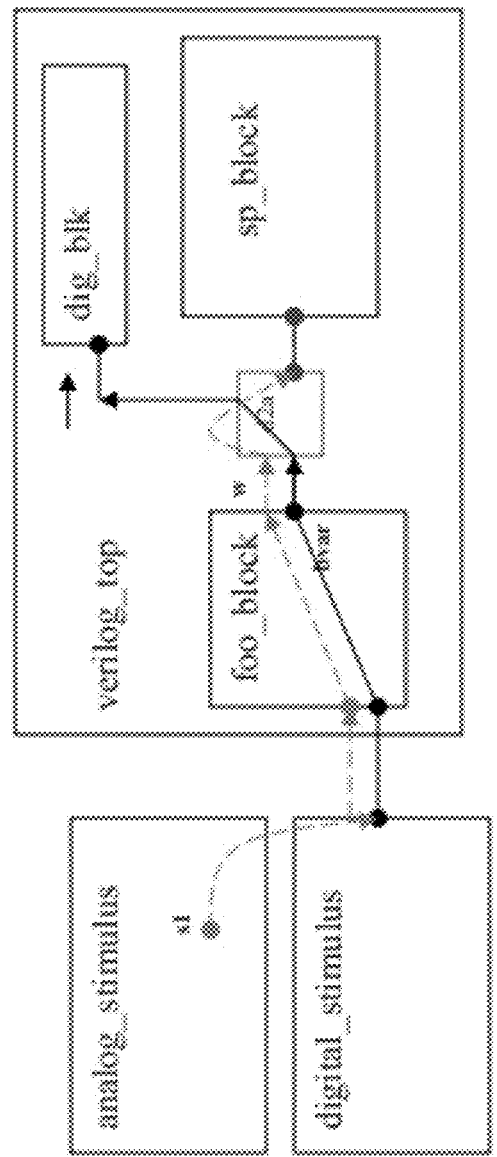
FIG. 13 illustrates an application of dual-value net properties to perform simulation.

To illustrate, reference is now made to FIG. 13 which shows how this approach can be taken to address the scenario of FIG. 4. With the concept of 'dual-value' signal property, a connection is established between a digital signal in digital stimulus and the real value 's1' in the analog stimulus. The hierarchical signal connection from digital stimulus block to 'foo_block' therefore carries two values—the regular digital signal 'logic' value (solid lines) and a real value from 's1' (dashed lines). When the special 'dual-value' signal-aware connect module (d2a) is inserted at the analog/digital boundary, the connect module senses the presence of the 'dual-value' signal and transmits the real value 's1' directly to the analog block 'sp_block' to which it is connected. It also sends the digital signal as-is to the digital block 'dig_blk'.

As is evident, this approach therefore allows the analog stimulus to be applied to the analog blocks without requiring a translation to occur at run-time, which is required by ordinary connect modules. This automated selection of the analog stimulus can be implemented without requiring customized compiler directives to be manually created and inserted into the design, since the connect modules can be inserted automatically to provide this functionality.

Figure 11:
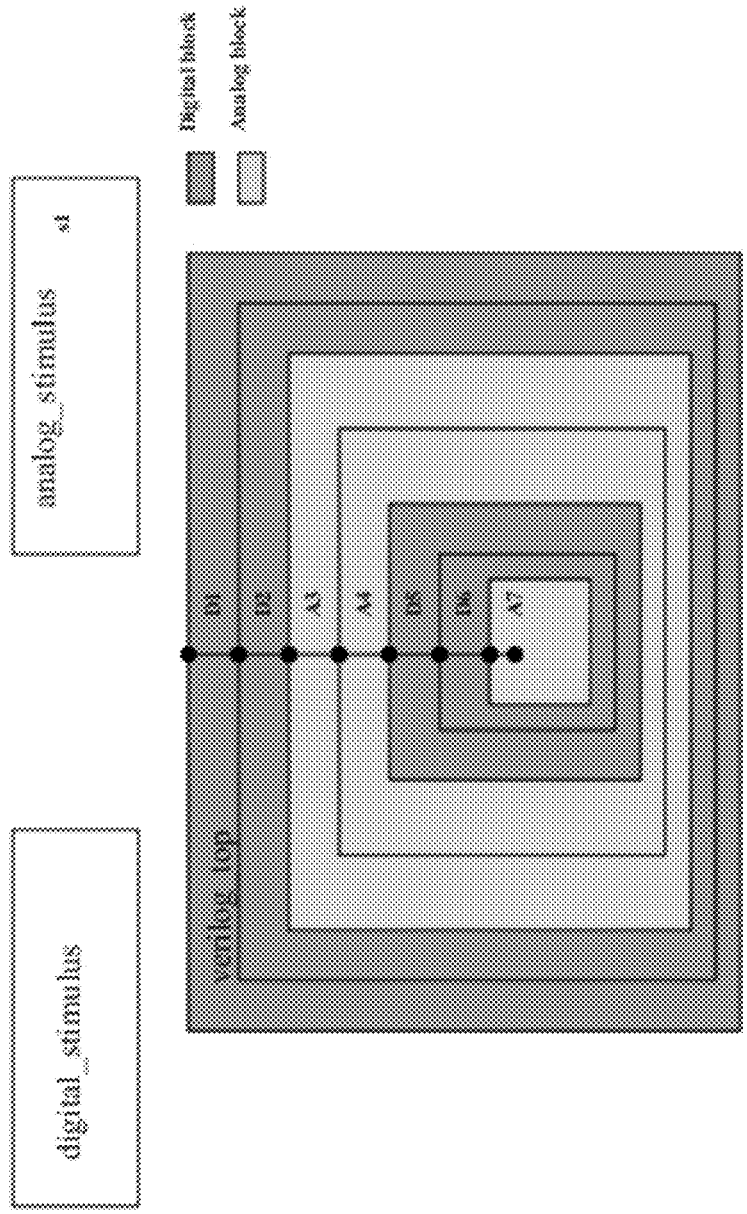
FIG. 11 illustrates a hierarchical design having both digital and analog portions.
Figure 14:
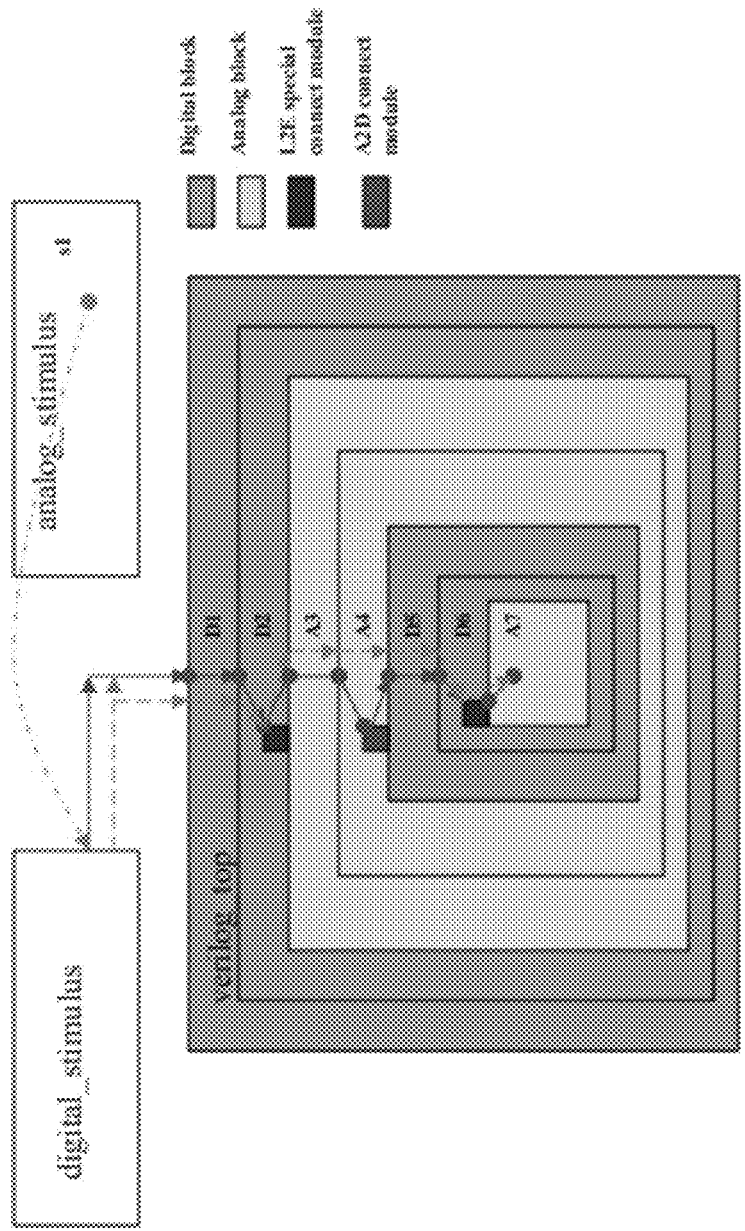
FIG. 14 illustrates an application of dual-value net properties to perform simulation in a hierarchical design.

FIG. 14 shows the results of applying this approach to the hierarchical design shown in FIG. 11. The analog stimulus 's1' is associated with digital stimulus via the 'dual-value' property. The digital stimulus is applied to digital net 'D1'. Via the approach described above, the 'dual-value' property is propagated through the entire hierarchical signal, i.e., from D1 to D2 to A3 to A4 to D5 to D6 to A7. The special L2E modules inserted across ports A3 and A7 therefore directly transmit the real value 's1' to the analog nets A3 and A7 respectively.

While this level of simulation may be acceptable for designs which are simulated without parasitic (e.g., pre-layout), it may be problematic under certain circumstances, e.g., for post-layout simulation which has parasitic effects applied on various net segments.

This document will now describe an embodiment in which support is provided for dual-value signals within digital islands and analog islands. This approach provides semantics for islands which facilitates simulation of post-layout designs which include parasitic effects via models like SDF and SPEF. For purposes of this description, an "analog island" refers to a collection of analog net segments that are connected to each other without any digital net segments between them. Similarly, a digital island is a term that is used to refer to a collection of digital net segments that are connected to each other without any analog net segments between them.

With the increasing ability of simulators to allow mix and match of analog and digital blocks, users have more opportunities to reconfigure the design to meet their performance and accuracy trade-off for verification. This in turn increases the need for a mixed-signal simulator to be aware of the 'analog' and 'digital' islands of a hierarchical signal for more accurate mixed-signal simulation.

FIG. 11 shows a single hierarchical signal with net segments D1, D2, A3, A4, D5, D6 and A7. The various islands formed in this single hierarchical signal are as follows:

1. D1, D2 form a digital island.
2. A3, A4 form an analog island.
3. D5, D6 form a digital island.
4. A7 forms an analog island.

To support 'dual-value' signals within islands, the process of FIG. 9 is modified to further include an action to determine the digital and analog islands after the design hierarchy is determined. Propagation of 'dual-value' property is then performed only within the net segments of the digital island which has a 'dual-value' digital net segment.

Figure 15:
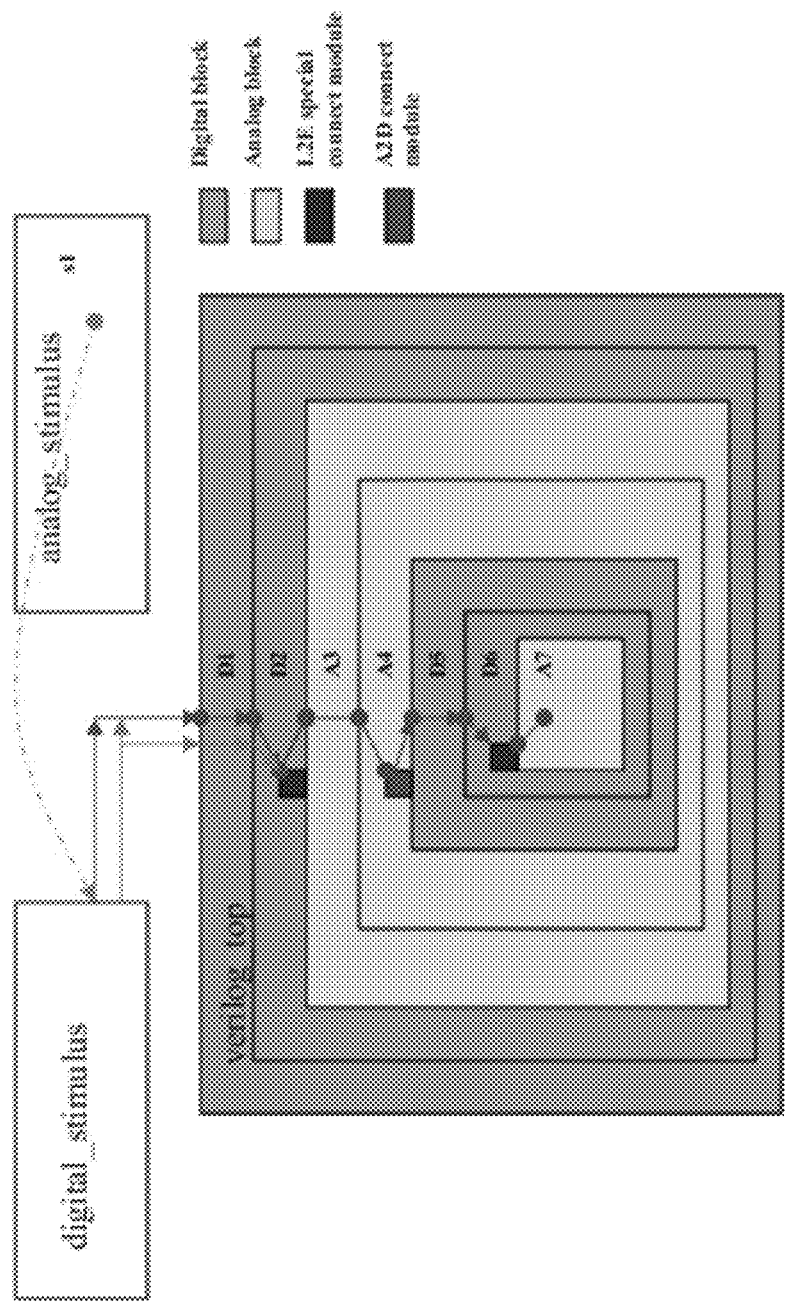
FIG. 15 illustrates an application of an alternative embodiment of the invention to apply dual-value net properties to perform simulation in a hierarchical design.

FIG. 15 shows the results of applying this approach to the design of FIG. 11. In this case, the analog stimulus 's1' propagates only to the digital island D1 and D2 and its value is directly transmitted to the analog island A3 and A4 only. The value from that analog island is then translated via regular E2L functionality to digital island D5 and D6. The resulting value from that digital island is then communicated via regular L2E functionality to the leaf level analog island A7. This ensures that the delay modeled between analog islands (A3, A4) and A7 are accounted for by the mixed-signal simulator.

This document will now describe an embodiment of the invention to address dual-value signals with vectors/buses. In addition to scalar net elements, it is important for the verification tool to be aware of vectors/buses, which are common in many modern designs. One of the most common scenarios is where individual bits of a bus connect to various elements of an iterated instance. For example, a 128-bit bus can represent a data input to a 128-bit multiplier design unit.

Figure 16:
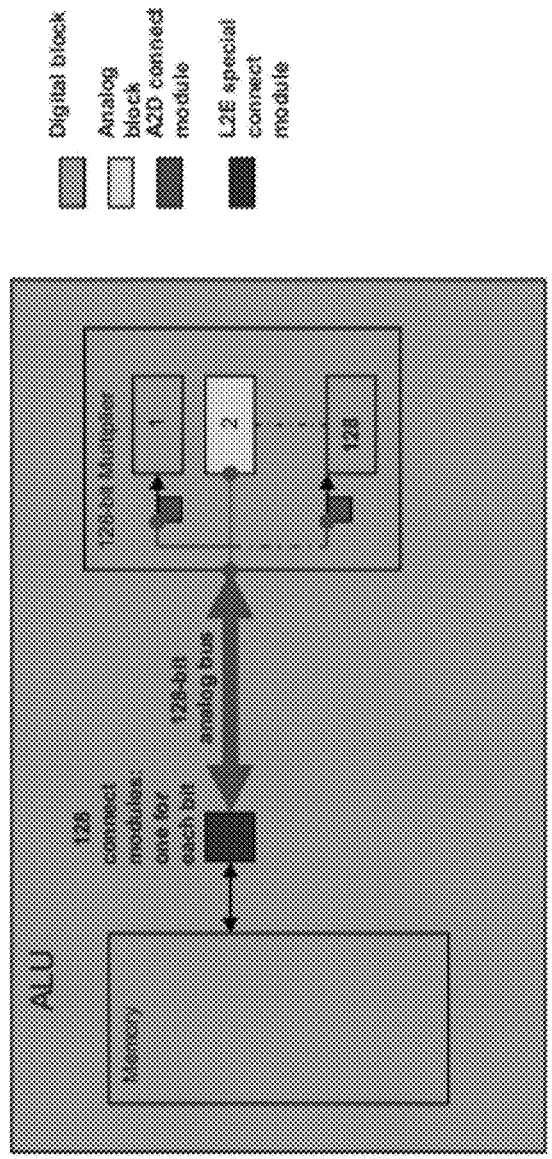
FIG. 16 illustrates an elaborated design of a 128-bit multiplier with a 128-bit analog bus

Another common scenario is where a set of related control signals are consolidated into a single bus which travels across the design hierarchy and feed into various components within the hierarchy. In either case, during mixed-signal verification, verification engineers often have to trade-off between speed versus accuracy by configuring some of those instances to digital and the others to analog. When individual bits of vector/bus connects to multiple such instances—some of which are analog and others which are digital—then, the entire bus resolves to a single domain (either analog or digital—depending on Verilog-AMS language semantics) and appropriate connect modules are inserted across bits of the bus that are at the analog/digital boundary. Such configurations can sometimes cause simulation slowdown as a single bit connection to an analog block causes an entire bus (which would have been digital otherwise) to become analog. For example, if one of the units of a 128-bit multiplier is configured to an analog block, then, the entire 128-bit data bus becomes an analog bus. This can introduce 127 connect modules between the analog bus and the other 127 digital units of the multiplier. FIG. 16 shows an example of this scenario.

However, certain EDA tools provide for the concept of a "mixed bus", which is a bus where parts of the bus can belong to analog domain and other parts of the bus can belong to the digital domain. The present embodiment utilizes a mixed-bus to optimize the connect modules and hence results in significant simulation speedup. This solution extends the previously described approach to support 'dual-value' vectors/buses for mixed buses. The present embodiment provides this support by identifying an individual net bit with 'cds_ams_src' attribute, and storing the 'logic' value net bit and its corresponding 'real' value net bit for hierarchical processing. During elaboration, the design is flattened and the analog/digital partitions are determined. A determination is made of the digital and analog islands for each bit of a hierarchical signal.

Next, the 'dual-value' property is propagated only within the net bit segments of the digital island which has a 'dual-value' digital net bit segment. At each analog/digital signal bit boundary, the special 'dual valued signal-aware' L2E connect module is inserted.

If the 'dual-value' digital signal bit connected to the connect module has a 'real' valued driver, then, that real value is directly transmitted to the analog block connected to that bit. Otherwise, the special L2E connect module simulates like a regular L2E connect module.

Figure 17:
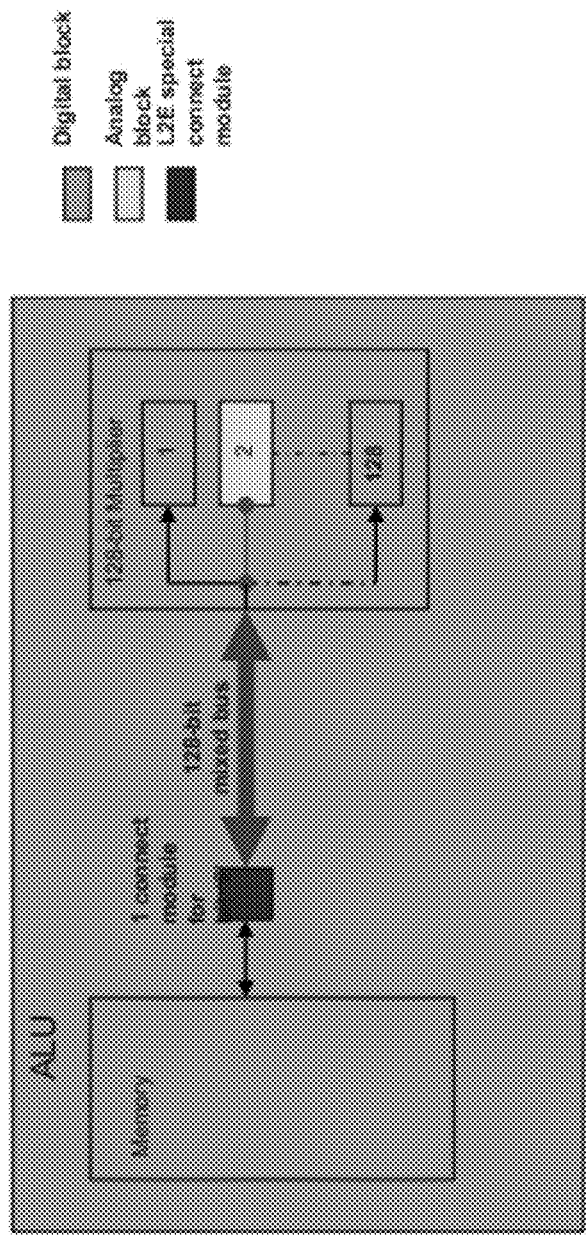
FIG. 17 illustrates an elaborated design of a 128-bit multiplier with a 128-bit mixed bus.

FIG. 17 shows an example of how a mixed-bus optimizes the connect modules and can result in significant simulation speedup. Instead of implementing 128 different connect modules, with one for each bit as shown in FIG. 16, the improved approach involves implementation of a connect module only for the analog blocks, e.g., as shown in FIG. 17 where only one connect module is implemented for bit '2' corresponding to the analog block of bit '2'. This solution extends the previously described approach to support 'dual-value'vectors/buses for mixed buses. Therefore, although the analog stimulus is available for all the bits of the bus, it will be applied only on the single bit of the bus which is connected to the analog block.

This document will now describe an alternative embodiment that provides support for dual-value signals that operate with signal coercion. With many modern designs, there is an increasing need for creation and simulation of real-valued digital-mixed-signal models which represent their behavioral analog and/or SPICE counterpart. Real-valued models preserve the accuracy of real-valued analog objects while providing a significant simulation performance boost as they are simulated using the digital simulator. U.S. patent application Ser. No. 12/571,726, filed on Oct. 1, 2009, entitled "METHOD AND SYSTEM FOR RE-USING DIGITAL ASSERTIONS IN A MIXED SIGNAL DESIGN", describes an approach for performing such coercion (hereinafter referred to as "wreal" coercion), which is hereby incorporated by reference in its entirety.

The approach of FIG. 9 describes the 'dual-value' property on a signal where one of the values is a Verilog 'logic' value while the other is a Verilog-AMS 'wreal' value. In the present embodiment, usage of a 'dual-value' property is enabled where both the values of the signal can be Verilog-AMS 'wreal' values. This extension becomes a powerful enabler for users to embrace real-valued models for simulation/verification. For example, a voltage and a current value of an analog net can be modeled using a 'dual-value' property on an equivalent digital 'wreal' signal.

The following approach enables such 'wreal' extensions to work with dual-value signals. The process begins by flattening the design, and after the design is flattened, the analog/digital partitions are determined. This is done for every bit of a signal. Next, a determination is made of the analog and digital islands for each bit of a signal. Within each digital island, the wreal coercion approach of U.S. patent application Ser. No. 12/571,726 is applied.

The dual-value property is then propagated only within the net bits of the digital island which has the dual-value bit segment. The wreal resolution approach of U.S. patent application Ser. No. 12/571,726 is applied to resolve the driver for each of the real values in the dual-value bit signal. A R2E connect module is used to transmit both the real values to the analog block, if the real value tagged via the 'cds_ams_src' attribute has a resolved driver. Otherwise, the special R2E module simulates like a regular R2E module.

Therefore, what has been described is an improved approach for performing verification of mixed signal designs. The present approach provides improved usability, since the definition of dual valued signals is simplified in the form of a standard Verilog attribute. It is a one-time effort to create those properties. Once those attributes are defined, then, the approach can automatically propagate the dual-value signal property through the signal hierarchy, inserting the appropriate connect module at an analog/digital boundary and simulating the dual-value signal. The verification engineer can create a variety of design configurations without any change to the testbench or the design. This results in a huge usability and productivity benefits.

In addition, the present invention provides improved quality of verification by allowing users to easily modify the design configurations to achieve the desired level of performance and accuracy. Such plug-n-play ability is not limited by any language, tool or flow restrictions. The advanced dual-value signal processing approach ensures that the stimulus values are applied at the appropriate places without requiring user intervention. Conventional solutions do not have any such mechanism to define once and re-run with numerous configurations without any editing of testbenches and/or designs. As a result, the present solution inherently results in better verification quality.

The present invention allows for easy porting and portability of information between various phases of design. For example, the same testbench and design can be used in Digital Mixed Signal(DMS) and Analog Mixed-Signal via commandline verification mode. Such portability adds an immense value to the design and verification process by eliminating risks due to communication between design and verification engineers.

The invention also furthers interoperability and reuse. Embodiments of the invention permits easy reuse of specialized connect modules (e.g., L2E connect modules) between various phases of design. The specialized connect modules will implicitly function as a regular connect module when there is no dual-value signal in the design. Such interoperability/re-use adds an immense value to the whole design and verification process by eliminating risks of communications errors between design and verification engineers, and also increases the value derived from creating such specialized L2E connect modules.

Embodiments of the invention also promotes extensibility, since the inventive idea is generic and can be easily applied to other languages and flows.

System Architecture Overview

Figure 18:
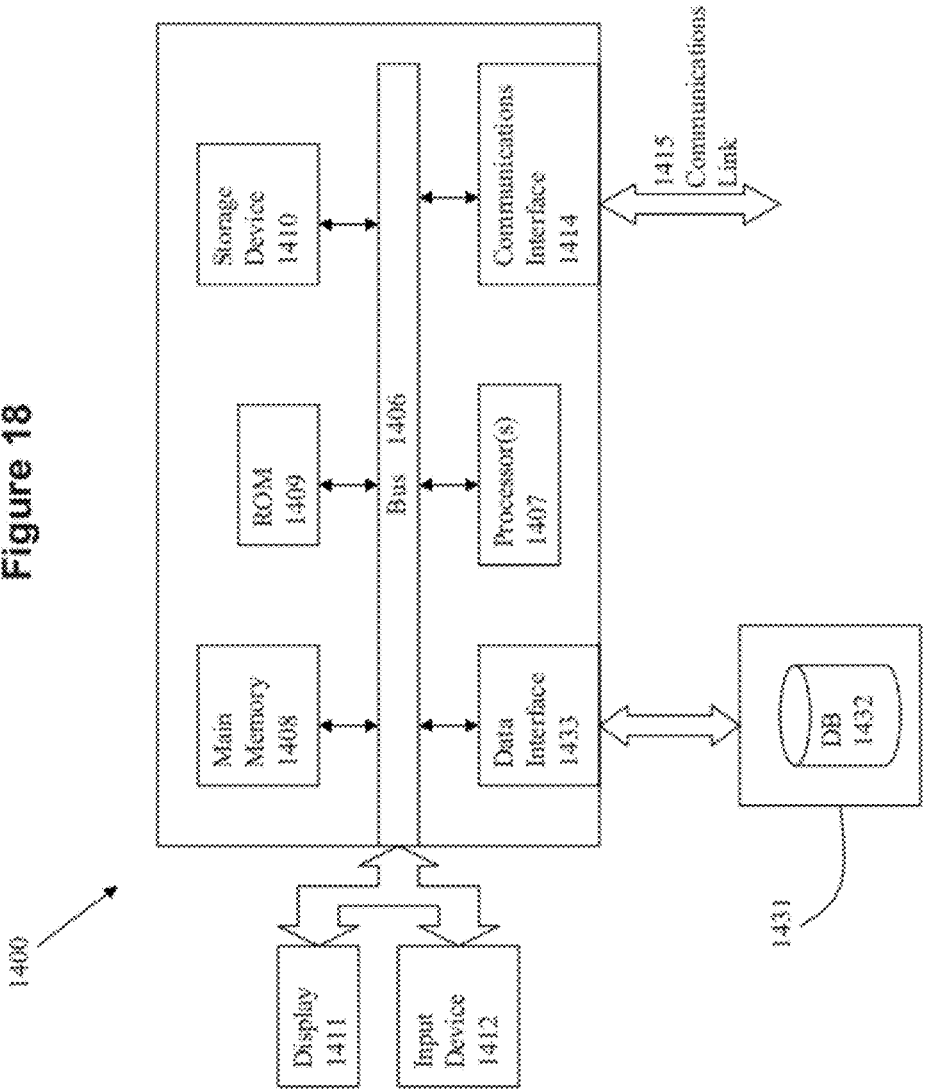
FIG. 18 depicts a computerized system on which a method for re-using digital assertions in a mixed signal context can be implemented.

FIG. 18 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, e.g., application code, through communication link 1415 and communication interface 1414. Received program code may be executed by processor 1407 as it is received, and/or stored in disk drive 1410, or other non-volatile storage for later execution. Computer system 1400 may communicate through a data interface 1433 to a database 1432 on an external storage device 1431.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A method implemented with a processor for handling analog and digital signal traffic for mixed-signal verification, comprising:
   using at least one processor to perform a process, the process comprising:
   identifying a digital value;
   identifying an analog value;
   propagating a dual-value signal corresponding to both the digital value and the analog value; and
   inserting an interface element into an electronic design that is to be verified, wherein
      the interface element utilizes the dual-value signal to transmit the analog value to an analog component and the digital value to a digital component during verification of the electronic design, and
      the dual-value signal includes both an analog representation of the signal and a digital representation of the signal without a need for analog-digital conversion for the digital value and the analog value of the signal.

2. The method of claim 1 in which the interface element comprises a connect module compliant with Verilog-AMS (analog-mixed signal).

3. The method of claim 1 in which the dual-value signal comprises a design language attribute that associated two values to the same digital net.

4. The method of claim 1 further comprising partitioning the electronic design into analog portions and digital portions, wherein the analog portions correspond to the analog component and the digital portions correspond to the digital component.

5. The method of claim 1 in which the dual-value signal is propagated to different levels of a design hierarchy.

6. The method of claim 1 in which the interface element provides translation services between a digital signal and an analog signal if the interface element is not handling the dual-value signal.

7. The method of claim 1, further comprising:
   determining analog islands and digital islands in the electronic design; and
   propagating the dual-value signal only within a segment of a digital island which corresponds to a dual-value net segment.

8. The method of claim 7 in which a delay is modeled by not transmitting the dual-value signal at certain lower levels of a hierarchy.

9. The method of claim 1, further comprising:
   identifying an analog net bit value and a digital net bit value for a net bit;
   determining analog and digital partitions in the electronic design;
   determining analog and digital islands for bits in the electronic design;
   propagating the dual-value signal only within a net bit segment of a digital island which corresponds to a dual-value net bit segment; and
   inserting the interface element at an analog/digital signal bit boundary.

10. The method of claim 9 in which the interface element utilizes the dual-value signal to transmit the analog bit value to an analog component connected to the an analog bit.

11. The method of claim 9 in which the analog bit value is available for multiple bits of a bus, but will be applied only to a bit that is connect to an analog block.

12. The method of claim 1 further comprising:
   determining analog and digital partitions in the electronic design;
   determining analog and digital islands for bits in the electronic design;
   applying wreal coercion to signals in the digital islands;
   propagating the dual-value signal within the net bits of the digital island which has a dual-value bit segment; and
   applying wreal resolution to resolve a driver for analog values in the dual-value signal.

13. A computer program product embodied on a non-transitory computer usable medium, the non-transitory computer readable medium having stored thereon a sequence of instructions which, when executed by a processor causes the processor to execute a method for handling analog and digital signal traffic for mixed-signal verification, the method comprising:
   identifying a digital value;

identifying an analog value;
propagating a dual-value signal corresponding to both the digital value and the analog value; and
inserting an interface element into an electronic design that is to be verified, wherein
the interface element utilizes the dual-value signal to transmit the analog value to an analog component and the digital value to a digital component during verification of the electronic design, and
the dual-value signal includes both an analog representation of the signal and a digital representation of the signal without a need for analog-digital conversion for the digital value and the analog value of the signal.

14. The computer program product of claim 13 in which the interface element comprises a connect module compliant with Verilog-AMS.

15. The computer program product of claim 13 in which the dual-value signal comprises a design language attribute that associated two values to the same digital net.

16. The computer program product of claim 13 further comprising partitioning the electronic design into analog portions and digital portions, wherein the analog portions correspond to the analog component and the digital portions correspond to the digital component.

17. The computer program product of claim 13 in which the dual-value signal is propagated to different levels of a design hierarchy.

18. The computer program product of claim 13 in which the interface element provides translation services between a digital signal and an analog signal if the interface element is not handling the dual-value signal.

19. The computer program product of claim 13, further comprising:
determining analog islands and digital islands in the electronic design; and
propagating the dual-value signal only within a segment of a digital island which corresponds to a dual-value net segment.

20. The computer program product of claim 19 in which a delay is modeled by not transmitting the dual-value signal at certain lower levels of a hierarchy.

21. The computer program product of claim 13, further comprising:
identifying an analog net bit value and a digital net bit value for a net bit;
determining analog and digital partitions in the electronic design;
determining analog and digital islands for bits in the electronic design;
propagating the dual-value signal only within a net bit segment of a digital island which corresponds to a dual-value net bit segment; and
inserting the interface element at an analog/digital signal bit boundary.

22. The computer program product of claim 21 in which the interface element utilizes the dual-value signal to transmit the analog bit value to an analog component connected to the an analog bit.

23. The computer program product of claim 21 in which the analog bit value is available for multiple bits of a bus, but will be applied only to a bit that is connect to an analog block.

24. The computer program product of claim 13 further comprising:
determining analog and digital partitions in the electronic design;
determining analog and digital islands for bits in the electronic design;
applying wreal coercion to signals in the digital islands;
propagating the dual-value signal within the net bits of the digital island which has a dual-value bit segment; and
applying wreal resolution to resolve a driver for analog values in the dual-value signal.

25. A system for handling analog and digital signal traffic for mixed-signal verification, comprising:
a processor;
a memory for holding programmable code which, when executed by the processor, causes the processor to: and
identify a digital value,
identify an analog value,
propagate a dual-value signal corresponding to both the digital value and the analog value, and
insert an interface element into an electronic design that is to be verified, wherein
the interface element utilizes the dual-value signal to transmit the analog value to an analog component and the digital value to a digital component during verification of the electronic design, and
the dual-value signal includes both an analog representation of the signal and a digital representation of the signal without a need for analog-digital conversion for the digital value and the analog value of the signal.

26. The system of claim 25 in which the interface element comprises a connect module compliant with Verilog-AMS.

27. The system of claim 25 in which the dual-value signal comprises a design language attribute that associated two values to the same digital net.

28. The system of claim 25 in which the programmable code includes instructions for partitioning the electronic design into analog portions and digital portions, wherein the analog portions correspond to the analog component and the digital portions correspond to the digital component.

29. The system of claim 25 in which the dual-value signal is propagated to different levels of a design hierarchy.

30. The system of claim 25 in which the interface element provides translation services between a digital signal and an analog signal if the interface element is not handling the dual-value signal.

31. The system of claim 25 in which the programmable code includes instructions for determining analog islands and digital islands in the electronic design and propagating the dual-value signal only within a segment of a digital island which corresponds to a dual-value net segment.

32. The system of claim 31 in which a delay is modeled by not transmitting the dual-value signal at certain lower levels of a hierarchy.

33. The system of claim 25 in which the programmable code includes instructions for identifying an analog net bit value and a digital net bit value for a net bit, determining analog and digital partitions in the electronic design, determining analog and digital islands for bits in the electronic design, propagating the dual-value signal only within a net bit segment of a digital island which corresponds to a dual-value net bit segment, and inserting the interface element at an analog/digital signal bit boundary.

34. The system of claim 33 in which the interface element utilizes the dual-value signal to transmit the analog bit value to an analog component connected to the an analog bit.

35. The system of claim 33 in which the analog bit value is available for multiple bits of a bus, but will be applied only to a bit that is connect to an analog block.

36. The system of claim 25 in which the programmable code includes instructions for determining analog and digital partitions in the electronic design, determining analog and digital islands for bits in the electronic design, applying wreal coercion to signals in the digital islands, propagating the dual-value signal within the net bits of the digital island which has a dual-value bit segment, and applying wreal resolution to resolve a driver for analog values in the dual-value signal.

* * * * *